US006596139B2

(12) United States Patent
Scott et al.

(10) Patent No.: US 6,596,139 B2
(45) Date of Patent: Jul. 22, 2003

(54) DISCONTINUOUS HIGH-MODULUS FIBER METAL MATRIX COMPOSITE FOR PHYSICAL VAPOR DEPOSITION TARGET BACKING PLATES AND OTHER THERMAL MANAGEMENT APPLICATIONS

(75) Inventors: Tim Scott, Post Falls, ID (US); Tamara White, Spokane, WA (US); Jianxing Li, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 97 days.

(21) Appl. No.: 09/765,526

(22) Filed: Jan. 19, 2001

(65) Prior Publication Data

US 2002/0096428 A1 Jul. 25, 2002

Related U.S. Application Data

(60) Provisional application No. 60/208,657, filed on May 31, 2000.

(51) Int. Cl.[7] .............................................. C23C 14/34
(52) U.S. Cl. .............................. 204/298.12; 204/298.13
(58) Field of Search ......................... 204/298.12, 298.13

(56) References Cited

U.S. PATENT DOCUMENTS

| | | | | |
|---|---|---|---|---|
| 5,043,049 A | * | 8/1991 | Takenaka | 204/192.15 |
| 5,167,920 A | | 12/1992 | Skibo et al. | 420/548 |
| 5,397,050 A | | 3/1995 | Mueller | 228/193 |
| 5,693,203 A | | 12/1997 | Ohhashi et al. | 204/298.12 |
| 6,183,686 B1 | | 2/2001 | Bardus et al. | 419/8 |

FOREIGN PATENT DOCUMENTS

| | | |
|---|---|---|
| EP | 0 223 478 A2 | 5/1987 |
| JP | 61288065 A | 12/1986 |
| JP | 62061056 | 3/1987 |
| JP | 01 062 462 A | 3/1989 |
| JP | 01 083 634 A | 9/1989 |
| JP | 03196619 | 8/1991 |
| JP | 07076771 | 3/1995 |
| JP | 09 003 641 A | 1/1997 |
| JP | 09 137 269 A | 5/1997 |
| WO | WO 92/17622 | 10/1992 |
| WO | WO 01/92594 A2 | 12/2001 |

OTHER PUBLICATIONS

CRC Handbook of Chemistry and Physics; David R. Lide, Editor–in–Chief; 80th Edition 1999–2000; pp. 12–193, 12–206, 12–45 to 12–47; 12–194.

* cited by examiner

Primary Examiner—Rodney G. McDonald
(74) Attorney, Agent, or Firm—Wells St. John P.S.

(57) ABSTRACT

The invention includes the use of a high-modulus fiber metal matrix composite material as a backing plate for physical vapor deposition targets, as a lid for microelectronics packages, as a heat spreader, and as a heat sink. In one implementation, copper-coated carbon fibers are mixed with copper powder. In another implementation, the mixture is consolidated to a carbon fiber metal matrix composite by using a vacuum hot press. The resultant backing plate has a coefficient of thermal expansion of $4.9 \times 10^{-6}$/C, thermal conductivity of at least 300 W/mK, density of greater than 99% of theoretical, and the composite material of the backing plate is 30% lighter than Cu while also having higher stiffness than Cu. The high-modulus fiber metal matrix composite backing plate can be used for high power W, Ta, and ceramic PVD targets.

25 Claims, 3 Drawing Sheets

DISCONTINUOUS HIGH-MODULUS FIBER METAL MATRIX COMPOSITE FOR PHYSICAL VAPOR DEPOSITION TARGET BACKING PLATES AND OTHER THERMAL MANAGEMENT APPLICATIONS

RELATED APPLICATION DATA

This application is related to U.S. Provisional application No. 60/208,657, which was filed May 31, 2000.

TECHNICAL FIELD

This invention relates to high-modulus fiber metal matrix composites for use as backing plates with physical vapor deposition targets and for use in constructions with semiconductor substrates. The invention also pertains to utilization of high-modulus fiber metal matrix composites in packaging applications, with the composites being used as, for example lids, heat spreaders and heat sinks.

BACKGROUND OF THE INVENTION

A normal PVD target assembly comprises a target and a backing plate. The target can be joined to the backing plate using mechanical, epoxy, solder or solid state diffusion. General requirements for the joint are high electrical and thermal conductivity, little or no distortion during sputtering, and good mechanical support. Mechanical joining provides a convenient mechanical support, but does not have good thermal and electrical conductivity, and so finds only limited application. Epoxy joining is easy, but an epoxy joint does not usually have good thermal and electrical properties. Solder and diffusion are the two most widely used methods for joining a target to a backing plate.

General requirements for the backing plate are high thermal and electrical conductivity, good mechanical strength, and most importantly, a coefficient of thermal expansion that closely matches the coefficient of thermal expansion of the target material. Target materials can comprise metal, consist essentially of metal, or consist of metal; and can comprise, for example, one or more of aluminum, copper, titanium, tungsten, tantalum, gold, and alloys thereof. Target materials can also, or alternatively, consist of, consist essentially of, or comprise, ceramic materials, such as, for example, lead, zirconate, and titanate (PZT); lead, lanthanum, zirconate, and titanate (PLZT); strontium barium tantalate (SBT); and barium strontium titanate (BST).

Materials such as aluminum, copper and molybdenum have been used as backing plate materials, but all have drawbacks due to either poor match to the physical properties of the target material or excessive cost. It would therefore be desirable to develop alternative backing plate materials.

SUMMARY OF THE INVENTION

The invention includes metal matrix composite backing materials for physical vapor deposition targets and for use in constructions with semiconductor substrates. The metal matrix composite backing materials of the present invention, can be used as, for example, microelectronics packaging lids, heat spreaders, and heat sinks. The metal matrix composite materials are constructed using a mixture of metal powder (Cu, Al, Ni, Ag, Ti, Co or an alloy of Cu, Al, Ni, Ag, Ti, Co) ranging in size from about −325 mesh size to about 100 mesh size, and discontinuous high-modulus material fibers, such as carbon, SiC, SiN, AlO, TiN, B, or combinations thereof, with fiber lengths ranging from about 10 microns to about 10 millimeters, and diameters ranging from about 1 micron to about 25 microns. It is noted that the listed fiber material compounds are described in terms of the materials in the compounds, rather in a specific stoichiometry. Thus, for example, the listed AlO can be $Al_2O_3$.

Depending on the application, the metal matrix composite materials can have a composition ranging from 1% by volume fiber to 70% by volume fiber. The materials can be consolidated by use of an axial loading method such as vacuum hot-press (preferred method), hot press, or squeeze casting. The terms "hot press" and "vacuum hot press" refer to processes in which powdered metal is compressed to form a structure without melting of the metal, and the term "squeeze casting" refers to a process wherein a molten metal is solidified under pressure to form a structure. When the metal material is copper and the fibers are carbon, the consolidated materials can have a coefficient of thermal expansion that ranges from about $3 \times 10^{-6}/°$ C. to about $17 \times 10^{-6}/°$ C.; depending on carbon fiber volume and alignment. Thermal conductivity can range from about 130 W/mK (watts/meter-Kelvin) to over 400 W/mK, depending on, for example, carbon fiber volume and alignment. The density of the composite material can range from about 4.9 g/cc (gram/cubic centimeter) to about 7.6 g/cc.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
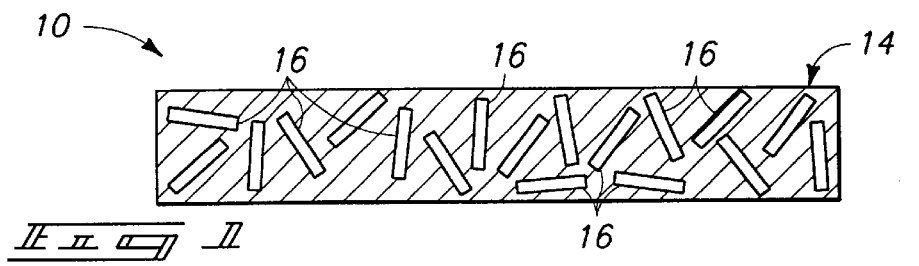
FIG. 1 shows a diagrammatic, cross-sectional view of a backing plate at a preliminary processing step of methodology encompassed by the present invention.

The invention encompasses a new material comprising carbon fibers dispersed in a metal matrix. The material can be used, for example, as a backing plate in a backing plate/target construction. In forming backing plate/target constructions, it is found that it is desirable to match the coefficient of thermal expansion (CTE) of the backing plate to that of the target material. If the CTE is not well matched, large thermally-induced stress can occur in the target backing plate assembly. Because of large CTE mismatch, low strength indium solder bonds have been used in conventional backing plate/target constructions to help relieve stress when the bond material deforms during thermal cycling. If high strength bonds are used instead of the low strength bonds, large deformation can occur in the backing plate/target construction. In the worst case with targets fabricated from brittle material, the target will fracture during thermal cycling.

One aspect of the present invention is a recognition that an engineered material, such as a high-modulus fiber metal matrix composite (MMC), can meet the requirements of a backing plate in a backing plate/target construction. For purposes of interpreting this disclosure and the claims that follow, a high-modulus fiber material is defined as a fiber material having a modulus higher than the metal matrix, preferably greater than 5 times higher than the metal matrix. For example, because the CTE of carbon fiber is extremely low (in fact, negative in the axial direction) it can be introduced into a metal matrix to cause a reduction in the overall CTE of the bulk material. The amount of reduction in CTE depends upon the volume fraction of carbon fiber and the alignment of the fibers. The fiber may be aligned in such a way as to cause the CTE reduction in only one direction or in only one plane.

MMC materials of the present invention can have other applications besides the above-discussed application as backing plates in backing plate/target constructions. For instance, the thermal-mechanical tunability of MMC materials can also make the materials excellent candidates for applications in microelectronics packaging. In applications such as lids, the MMC can be adjusted to approximately match the CTE of the package, thus improving reliability. For heat spreaders or heat sinks, not only can the CTE be controlled with MMC materials, but the directionality of the fibers within the materials can be controlled to control heat flow through the part.

In one aspect of the invention, 10 micron diameter carbon fibers of 200 micron average length are plated with approximately 30 weight percent of copper. The copper plated carbon fibers are mixed with a determined weight of −325 mesh copper powder such that the desired volume percent of carbon fiber is achieved. The copper plated carbon fiber/copper powder mixture is then vacuum hot pressed into a desired shape. The vacuum hot-pressing can occur at a temperature of from about 800° C. to about 1000° C., and at a pressure range of from about 4000 psi to about 6000 psi.

Figure 2:
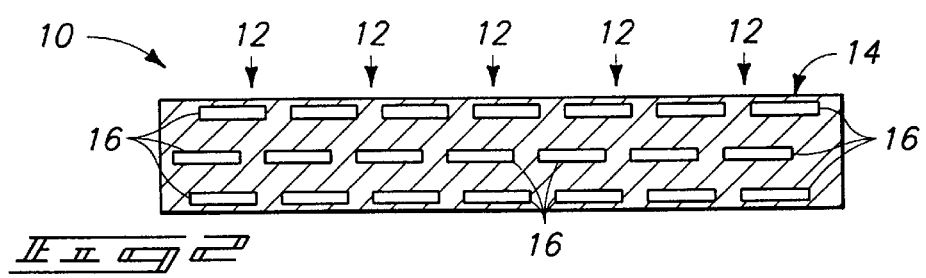
FIG. 2 is a view of the FIG. 1 backing plate shown at a processing step subsequent to that of FIG. 1.

FIGS. 1 and 2 illustrate an effect of hot-pressing of a disc-shaped backing plate 10. The plate 10 is shown in cross-sectional side view in the preliminary processing step of FIG. 1, and carbon fibers 16 are visible extending throughout a metal matrix material of the plate 10. At the initial processing step of FIG. 1, the fibers are distributed about substantially random orientations. The backing plate 10 is shown comprising an upper surface 14.

FIG. 2 illustrates the backing plate of FIG. 1 as a pressing force is directed against the upper surface 14. Specifically the pressing force is illustrated by arrows 12 directed against surface 14. The pressing force can be generated by, for example, a hot press. Such press applies an axial pressure to pressed surface 14. As a result of the axial pressure, carbon fibers 16 align themselves parallel to the axis on which the force is applied. When the fibers are so aligned, the coefficient of thermal expansion is reduced in a plane aligned with the fibers. In disc-shaped plate 10, for example, the fibers are aligned parallel to the plane of the surface 14 of the disc after pressing on the surface of the disc. Accordingly, the CTE in the directions parallel to the surface is greatly reduced.

The backing plate CTE can be adjusted by changing the volume percent of carbon fiber in the composite material to approximately match the CTE of the target material, or in particular cases to even exactly match the CTE of the target material. When the CTE of the backing plate and the CTE of the target are matched, thermally induced stress can be eliminated from an interface between the two. The result can be a strong and reliable backing plate/target assembly, which can withstand the demands of high power sputtering.

A backing plate, or other MMC component formed in accordance with the present invention, will preferably have good thermal conductivity for heat dissipation. In the case of the MMC backing plate of the present invention, the thermal conductivity is reduced through the horizontal thickness, but is unchanged in the vertical cross-sectional plane aligned with the fibers. This effectively causes the MMC backing plate to act as a heat spreader, further reducing the possibility of thermal stress in the backing plate/target assembly.

A backing plate, or other MMC component formed in accordance with the present invention, will preferably have good mechanical strength. Compared to copper the MMC material is stiffer, and more than 30% lighter, which can be a significant improvement for larger parts.

Figure 3:
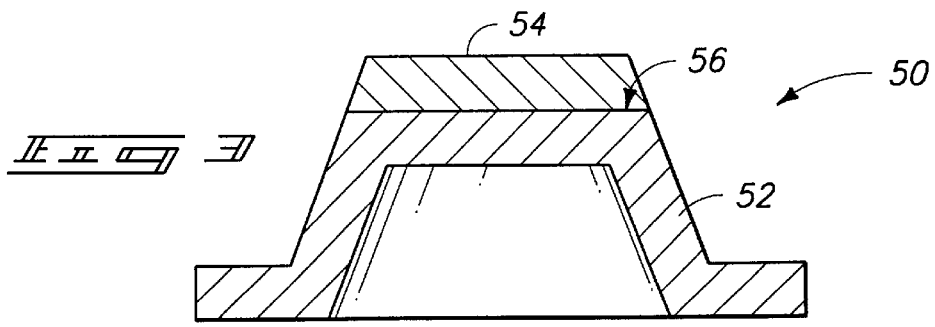
FIG. 3 shows a diagrammatic, cross-sectional side view of a target/backing plate construction formed in accordance with methodology of the present invention. The construction corresponds to a large ENDURA™ configuration.
Figure 4:
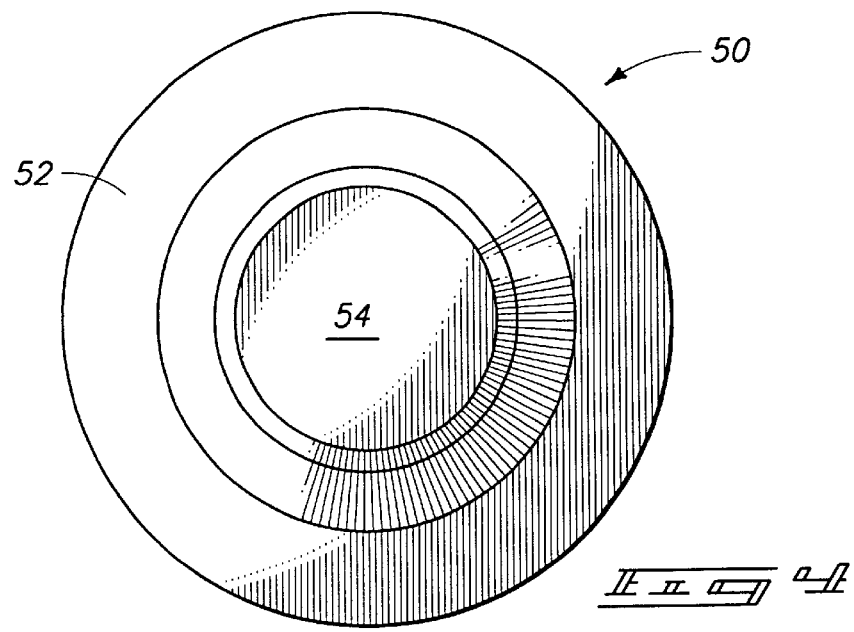
FIG. 4 is a top view of the target/backing plate construction of FIG. 3.

An exemplary backing plate/target assembly encompassed by the present invention is shown in FIGS. 3 and 4 as assembly 50. Assembly 50 comprises a backing plate 52 bonded to a target 54. Backing plate 52 and target 54 join at an interface 56, which can comprise, for example, a diffusion bond between the backing plate and target; or which can comprise, for example, a solder bond. Backing plate 52 can comprise an MMC construction, such as, for example, a copper matrix having carbon fibers distributed therethrough. Target 54 can comprise, for example, a tungsten target.

EXAMPLE 1

Milled carbon fiber with an average length of 200 um and a diameter of 10 um coated with 30 weight percent Cu is mixed with −325 mesh Cu powder to achieve volume loading of 50 percent carbon fiber. The mixture is blended for three hours. The blended mixture is placed into a graphite hot press die that was prepared by lining the die with spray-on boron nitride. The loaded die assembly is placed and properly aligned in a hot press chamber; five tons of pressure is applied; and the chamber is vacuumed down to $1.5 \times 10^{-3}$ torr. Upon reaching the called-for vacuum, the temperature is ramped up to 875° C. at a rate of 300° C./hour. Once a desired temperature is reached, the pressure is increased to 4500 psi at a rate of 10 tons/minute. The temperature of 875° C. is maintained for about one hour, at which time the chamber is back-filled with argon to a pressure of 507 torr, and the temperature is ramped down to 300° C. Pressure is maintained at 4500 psi until the temperature reaches 300° C.; then the pressure is released and the heater is turned off.

Figure 5A:
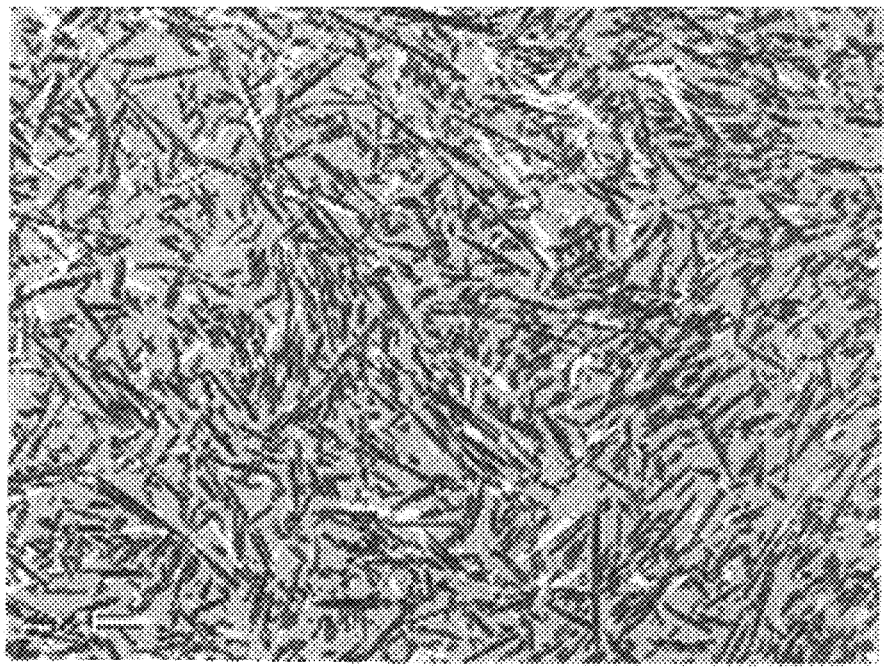
FIGS. 5A and 5B show scanning electron microscope images of a material encompassed by the present invention, and specifically show the alignment of the carbon fibers in relation to a plan view (FIG. 5A) and cross sectional view (FIG. 5B).
Figure 5B:
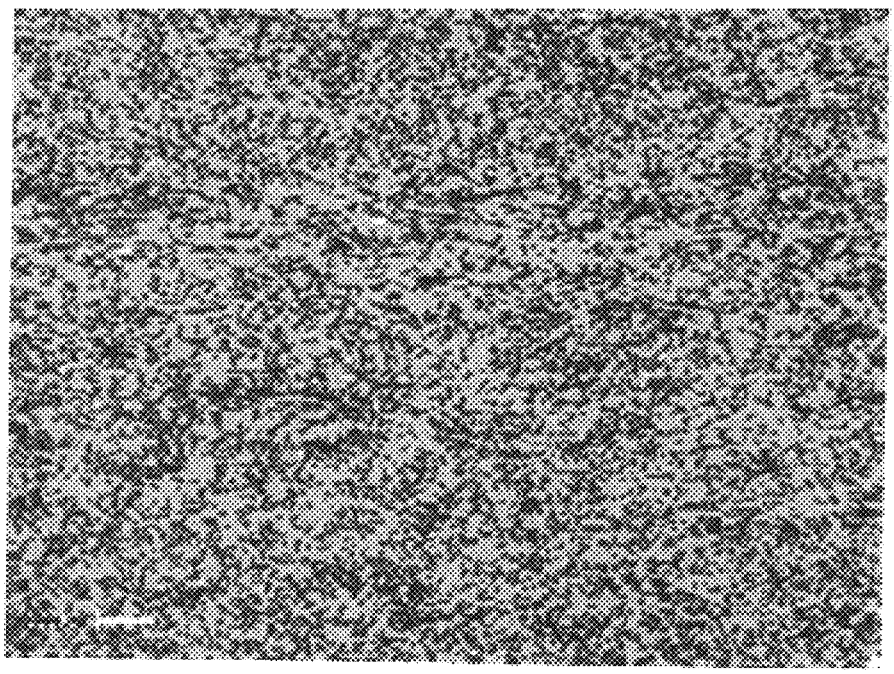

The part resulting from the aforementioned process has a measured density of 5.56 g/cc, which is 99.5% of the theoretical value of 5.59 g/cc. Metalography and SEM imaging of polished samples show an even distribution of the fibers throughout the matrix, and also show that the fibers are aligned perpendicular to the axis on which the forming pressure was applied. Additionally, it is found that the fibers are randomly aligned within their plane of alignment. FIGS. 5A and 5B show scanning electron microscope images illustrating the alignment of carbon fibers in relation to a plan view and cross sectional view of the carbon fibers within the matrix.

The coefficient of thermal expansion in the longitudinal direction is $4.9 \times 10^{-6}/°$ C., and in the transverse direction is $17 \times 10^{-6}/°$ C. The thermal conductivity in the longitudinal direction is 300 W/mK, and in the transverse direction is 130 W/mK. The experiment was repeated, and the results were duplicated.

EXAMPLE 2

Milled carbon fiber with an average length of 200 um and a diameter of 10 um coated with 30 weight percent Ni is mixed with −325 mesh Cu powder to achieve volume loading of 50 percent carbon fiber. The mixture is blended for three hours. The blended mixture is placed into a graphite hot press die that was prepared by lining the die with spray-on boron nitride. The loaded die assembly is placed and properly aligned in the hot press chamber, five tons of pressure is applied, and the chamber is vacuumed down to $1.5\times10^{-3}$ torr. Upon reaching the desired vacuum, the temperature is ramped up to 875° C. at a rate of 300° C./hour. Once temperature is reached, the pressure is increased to 4500 psi at a rate of 10 tons/minute. The temperature of 875° C. is maintained for one hour, at which time the chamber is back-filled with argon to a pressure of 507 torr and the temperature is ramped down to 300° C. The pressure is maintained at 4500 psi until the temperature reaches 300° C., and then the pressure is released and the heater is turned off.

The part resulting from the aforementioned process has a measured density of 5.57 g/cc, which is 99.6% of the theoretical value of 5.59 g/cc. Metalography and SEM imaging of polished samples showed an even distribution of the fibers throughout the matrix, and also shows that the fibers are aligned perpendicular to the axis on which the forming pressure was applied. The fibers were randomly aligned within their plane of alignment. The coefficient of thermal expansion in the longitudinal direction is $4.8\times10^{-6}/°$ C. and in the transverse direction is $17\times10^{-6}/°$ C. The thermal conductivity in the longitudinal direction is 91.73 W/mK and in the transverse direction is 39.75 W/mK.

The experiment was repeated, and the results presented were duplicated.

EXAMPLE 3

Milled carbon fiber with an average length of 200 um and a diameter of 10 um coated with 30 weight percent Cu is mixed with −325 mesh Cu powder to achieve volume loading of 40 percent carbon fiber. The mixture is blended for three hours. The blended mixture is placed into a graphite hot press die that was prepared by lining the die with spray-on boron nitride. The loaded die assembly is placed and properly aligned in the hot press chamber, five tons of pressure is applied, and the chamber is vacuumed down to $1.5\times10^{-3}$ torr. Upon reaching the desired vacuum, the temperature is ramped up to 875° C. at a rate of 300° C./hour. Once the desired temperature is reached, the pressure is increased to 4500 psi at a rate of 10 tons/minute. The temperature of 875° C. is maintained for about one hour, at which time the chamber is back-filled with argon to a pressure of 507 torr, and the temperature is ramped down to 300° C. The pressure is maintained at 4500 psi until the temperature reaches 300° C., and then the pressure is released and the heater is turned off.

The part resulting from the aforementioned process has a measured density of 5.78 g/cc, which is 99.6% of the theoretical value of 5.8 g/cc. Metalography and SEM imaging of polished samples showed an even distribution of the fibers throughout the matrix; that the fibers are aligned perpendicular to the axis on which the forming pressure was applied; and that within their plane of alignment the fibers were randomly aligned. The coefficient of thermal expansion in the longitudinal direction is $6.3\times10^{-6}/°$ C. and in the transverse direction is $17\times10^{-6}/°$ C. The thermal conductivity in the longitudinal direction is 370 W/mK and in the transverse direction is 130 W/mK. The experiment was repeated, and the results presented were duplicated.

Figure 6:
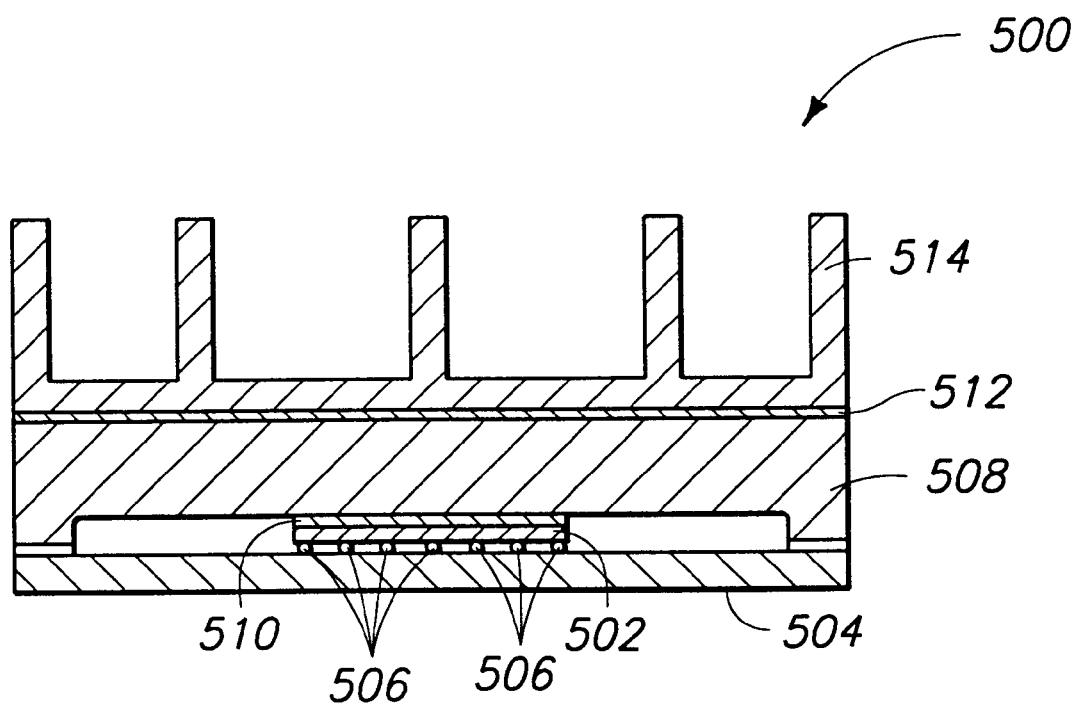
FIG. 6 is a diagrammatic cross-sectional view of a semiconductor package comprising components encompassed by the present invention.

Although the invention is described above with reference to backing plate/target assemblies, it is to be understood that high-modulus fiber metal matrix composite materials of the present invention (i.e., materials in which fibers are dispersed in a metal matrix, and in which the fibers have a modulus at least about five-times greater than that of the metal matrix) can be utilized in other embodiments of the invention. For instance, FIG. 6 illustrates a semiconductor package 500. The package comprises a semiconductor chip (or die) 502 connected to a substrate 504 (which can be, for example, a circuit board) through electrical interconnects 506 (which can comprise, for example, solder beads). Chip 502 can be considered to be a semiconductor substrate, with the term "semiconductor substrate" defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A lid 508 is provided over substrate 504 and chip 502 to form a protective cover over the chip. Lid 508 can comprise a high-modulus fiber metal matrix composite material of the present invention, and can be referred to as a microelectronics packaging lid. An exemplary metal matrix of lid 508 is copper or aluminum, and an exemplary high modulus fiber is a carbon fiber. Lid 508 can comprise a metal matrix having high modulus fibers dispersed therein, consist essentially of a metal matrix having high modulus fibers dispersed therein, or consist of a metal matrix having high modulus fibers dispersed therein.

In the shown embodiment, lid 508 is thermally connected to chip 502 through a thermal interface material 510. Thermal interface material 510 enables heat to efficiently pass from chip 502 to lid 508. Lid 508 can then dissipate the heat. In the shown embodiment, lid 508 is substantially planar, and accordingly dissipates the heat primarily in two dimensions, instead of three. Lid 508 can thus be considered a heat spreader. If lid 508 was constructed to dissipate the heat in three dimensions, it would be a heat sink. It is noted that the shown thermal interface material 510 can be omitted to leave an air gap, or replaced by a non-thermally conductive material. In either event, heat would no longer efficiently pass from chip 502 to lid 508, so the lid would only be a microelectronics packaging lid, and not a heat spreader. Alternatively, thermal interface material 510 can be omitted and lid 508 can be placed directly on semiconductor substrate 502. In such alternative construction, heat may, in some embodiments, pass efficiently to lid 508 so that the lid is a heat spreader; and in other embodiments the heat may not pass efficiently so that lid 508 is not an effective heat spreader.

A thermally conductive interface material 512 is provided over lid 508, and a heat sink 514 is over interface material 512. Interface 512 can comprise, for example, a GELVET™ material (available from Honeywell International, Inc.™), and heat sink 514 can comprise, for example, a high-modulus fiber metal matrix composite material of the present invention. An exemplary metal matrix of heat sink 514 is copper or aluminum, and an exemplary high modulus fiber is a carbon fiber. Heat sink 514 can comprise a metal matrix having high modulus fibers dispersed therein, consist essentially of a metal matrix having high modulus fibers dispersed therein, or consist of a metal matrix having high modulus fibers dispersed therein.

What is claimed is:

1. A backing plate material comprised of a metal matrix and fibers dispersed within the metal matrix, the fibers comprising one or more materials selected from the group consisting of SiN, AlO, TiN, B, and elemental carbon; with the compounds, SiN, AlO and TIN being described in terms of components of the compounds rather than stoichiometry, the fibers having a higher modulus than the metal matrix, the backing plate material having a surface, the fibers being aligned within the backing plate material parallel to the surface.

2. The backing plate material of claim 1 wherein the modulus of the fibers is at least five-times higher than the modulus of the metal matrix.

3. The backing plate material of claim 1 wherein the metal of the metal matrix comprises one or more of Cu, Al, Ni, Ag, Ti, and Co.

4. The backing plate material of claim 1 wherein the fibers have a diameter of from about 1 micron to about 25 microns, and a length of from about 10 microns to about 10 millimeters.

5. The backing plate material of claim 1 wherein the fibers have a coefficient of thermal expansion of less than $10 \times 10^{-6}/°C$.

6. The backing plate material of claim 1 comprising from about 1% to about 70%, by volume, of the fibers within the metal matrix.

7. The backing plate material of claim 1 wherein the fibers further comprise SiC, with SiC being described in terms of components of the compounds rather than stoichiometry.

8. An assembly comprising a ceramic material target bonded to a backing plate; the backing plate comprising:

metal; and fibers dispersed within the metal and having a higher-modulus than the metal, the fibers being aligned within the backing plate parallel to a surface of the backing plate.

9. The assembly of claim 8 wherein the modulus of the fibers is at least five-times higher than the modulus of the metal.

10. The assembly of claim 8 wherein the ceramic material of the target is selected from the group consisting of PZT, PLZT, BST and SBT.

11. The assembly of claim 8 wherein the metal of the backing plate comprises copper.

12. The assembly of claim 8 wherein the metal of the backing plate consists of copper.

13. The assembly of claim 8 wherein the metal of the backing plate consists essentially of copper.

14. The assembly of claim 8 wherein the metal of the backing plate comprises copper and wherein the fiber consists essentially of one or more materials selected from the group consisting of carbon, SiC, SiN, AlO, TiN, B; with the compounds SiC, SiN, AlO and TiN being described in terms of components of the compounds rather than stoichiometry.

15. An assembly comprising a first material target bonded to a second material backing plate; the second material being different than the first material; the second material comprising metal and fibers dispersed within the metal; the fibers being aligned within the second material parallel to a planar surface of the backing plate, the fibers having a modulus that is at least five-times larger than a modulus of the metal; the relative amount of fibers and metal in the second material being configured to provide the second material with about the same coefficient of thermal expansion as the first material.

16. The assembly of claim 15 wherein the first material comprises one or more of aluminum, copper, titanium, tungsten, tantalum and gold.

17. The assembly of claim 15 wherein the second material comprises copper metal and carbon fibers dispersed within the copper metal.

18. The assembly of claim 15 wherein the second material consists essentially of copper metal and carbon fibers dispersed within the copper metal.

19. The assembly of claim 15 wherein the second material consists of copper metal and carbon fibers dispersed within the copper metal.

20. A backing plate material comprised of a metal matrix and fibers dispersed within the metal matrix, the metal of the metal matrix comprising one or more of Cu, Ni, Ag, Ti, and Co, the fibers having a higher modulus than the metal matrix, the backing plate material having a surface, the fibers being aligned within the backing plate material parallel to the surface.

21. The backing plate material of claim 20 wherein the fibers comprise one or more materials selected from the group consisting of SiC, SiN, AlO, TiN, B, and elemental carbon; with the compounds SiC, SiN, AlO and TiN being described in terms of components of the compounds rather than stoichiometry.

22. The backing plate material of claim 20 comprising from about 1% to about 70%, by volume, of the fibers within the metal matrix.

23. The backing plate material of claim 20 wherein the fibers have a diameter of from about 1 micron to about 25 microns, and a length of from about 10 microns to about 10 millimeters.

24. The backing plate material of claim 20 wherein the modulus of the fibers is at least five-times higher than the modulus of the metal matrix.

25. The backing plate material of claim 20 wherein the fibers are randomly dispersed within a plane parallel to the surface.

* * * * *

UNITED STATES PATENT AND TRADEMARK OFFICE
CERTIFICATE OF CORRECTION

PATENT NO.   : 6,596,139 B2                                      Page 1 of 1
DATED        : July 22, 2003
INVENTOR(S)  : Scott et al.

It is certified that error appears in the above-identified patent and that said Letters Patent is hereby corrected as shown below:

Column 7,
Line 8, replace "TIN" with -- TiN --.
Lines 25-26, replace "$10 \times 10^-{}_6/^\circ C$" with -- $10 \times 10^{-6}/^\circ C$ --.

Signed and Sealed this

Twenty-third Day of September, 2003

JAMES E. ROGAN
*Director of the United States Patent and Trademark Office*